US009946156B2

(12) United States Patent
Sato

(10) Patent No.: US 9,946,156 B2
(45) Date of Patent: Apr. 17, 2018

(54) IMPRINT APPARATUS, METHOD OF MANUFACTURING ARTICLE AND ALIGNMENT APPARATUS

(71) Applicant: CANON KABUSHIKI KAISHA, Tokyo (JP)

(72) Inventor: Hiroshi Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 621 days.

(21) Appl. No.: 14/231,827

(22) Filed: Apr. 1, 2014

(65) Prior Publication Data
US 2014/0300016 A1 Oct. 9, 2014

(30) Foreign Application Priority Data

Apr. 3, 2013 (JP) .................................. 2013-078093

(51) Int. Cl.
*B29C 59/16* (2006.01)
*G03F 7/00* (2006.01)

(52) U.S. Cl.
CPC .................................. *G03F 7/0002* (2013.01)

(58) Field of Classification Search
CPC ... B29C 59/02; B29L 2007/001; G03F 7/0002
USPC ............. 264/40.1, 40.5, 293; 425/150, 174.4
See application file for complete search history.

(56) References Cited

U.S. PATENT DOCUMENTS

| 8,390,809 B2 | 3/2013 | Hayashi |
| 8,432,548 B2 | 4/2013 | Choi et al. |
| 8,529,823 B2 * | 9/2013 | Den Boef ............... B82Y 10/00 264/293 |
| 2006/0126058 A1 * | 6/2006 | Nimmakayala ........ B82Y 10/00 356/139.04 |
| 2010/0230836 A1 | 9/2010 | Yu |
| 2011/0198769 A1 * | 8/2011 | Maeda ................... B82Y 10/00 264/40.5 |
| 2011/0278768 A1 * | 11/2011 | Sato ........................ B82Y 10/00 264/406 |

(Continued)

FOREIGN PATENT DOCUMENTS

| CN | 101833238 A | 9/2010 |
| CN | 102096348 A | 6/2011 |

(Continued)

OTHER PUBLICATIONS

Office Action issued in Japanese patent application No. 2013078093 dated Jan. 6, 2017.

(Continued)

*Primary Examiner* — Nahida Sultana
(74) *Attorney, Agent, or Firm* — Rossi, Kimms & McDowell LLP

(57) ABSTRACT

The present invention provides an imprint apparatus comprising at least one first detector configured to detect a first number of first marks among a plurality of marks formed in the plurality of shot regions, a second detector having a field of view wider than that of the first detector, and configured to detect a second number of second marks different from the first marks among the plurality of marks, the second number being larger than the first number, and a controller configured to align the plurality of shot regions and the mold by using a detection result from the second detector.

12 Claims, 7 Drawing Sheets

(56) References Cited

U.S. PATENT DOCUMENTS

| | | |
|---|---|---|
| 2011/0290136 A1 | 12/2011 | Koga |
| 2012/0091611 A1 | 4/2012 | Yanagisawa |
| 2012/0225152 A1* | 9/2012 | Wuister ............... B82Y 10/00 425/150 |
| 2012/0292801 A1* | 11/2012 | Maeda ............... G03F 9/7042 264/40.5 |
| 2012/0313295 A1* | 12/2012 | Den Boef ............ B82Y 10/00 264/406 |
| 2013/0181365 A1* | 7/2013 | Shinoda ............... B29C 59/02 264/40.1 |
| 2013/0193602 A1* | 8/2013 | Suzuki ............... B29C 59/002 264/40.1 |
| 2014/0339721 A1* | 11/2014 | Toshima ............ G03F 7/0002 264/40.5 |
| 2015/0028506 A1* | 1/2015 | Sato ................. G03F 7/0002 264/40.1 |
| 2015/0192515 A1* | 7/2015 | Iwai ................. G03F 9/7088 355/53 |
| 2015/0251348 A1* | 9/2015 | Usui ................. G03F 7/0002 264/40.1 |
| 2016/0075076 A1* | 3/2016 | Sato ................. G03F 7/0002 264/40.5 |
| 2016/0139510 A1* | 5/2016 | Iwasaki ................ G03F 9/70 430/325 |
| 2017/0040196 A1* | 2/2017 | Takakuwa .......... H01L 21/3105 |
| 2017/0043511 A1* | 2/2017 | Sato ................. B29C 43/58 |

FOREIGN PATENT DOCUMENTS

| | | |
|---|---|---|
| JP | 2006267191 A | 10/2006 |
| JP | 2007-305647 A | 11/2007 |
| JP | 4185941 B2 | 11/2008 |
| JP | 2009212153 A | 9/2009 |
| JP | 2012-507882 A | 3/2012 |
| JP | 2012084732 A | 4/2012 |
| JP | 2012-243863 A | 12/2012 |
| KR | 1020090093899 A | 9/2009 |
| KR | 1020110132238 A | 12/2011 |
| TW | 201019388 A1 | 5/2010 |
| WO | 2010053519 A2 | 5/2010 |

OTHER PUBLICATIONS

Office Action issued in Korean Appln. No. 10-2014-0039142, dated Mar. 2, 2016.

Office Action issued in Chinese Appln. No. 201410127464.9 dated Jan. 26, 2017. English translation provided.

* cited by examiner

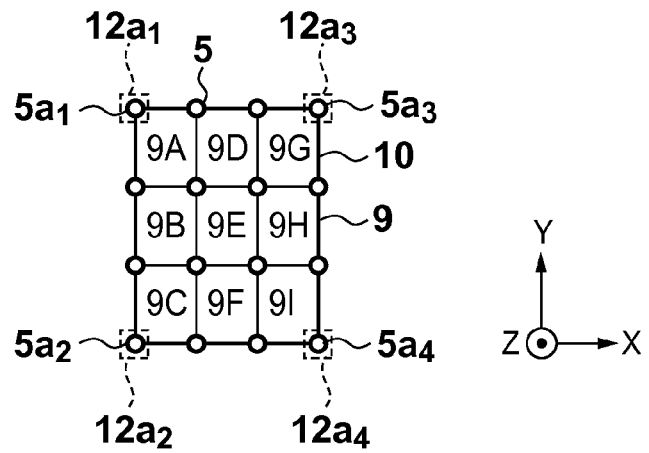
F I G. 5A
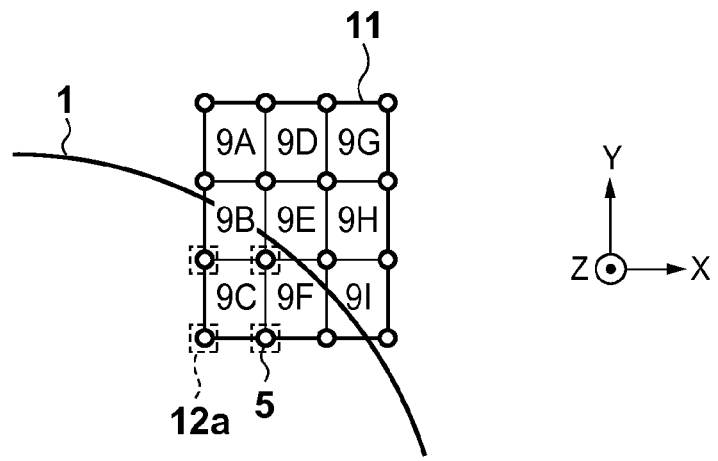
F I G. 5B
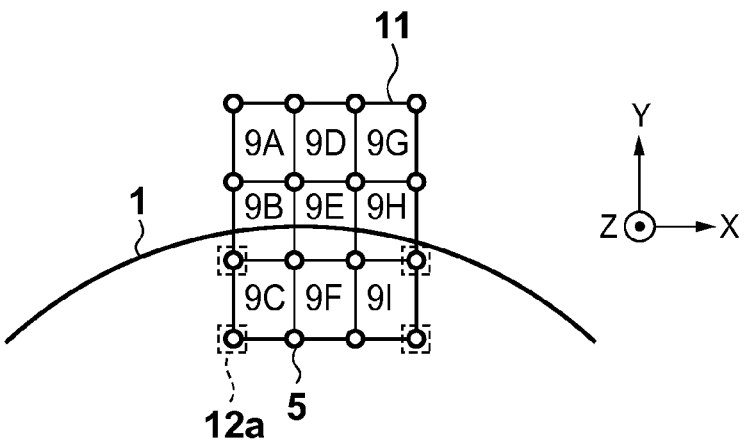
F I G. 5C

F I G. 8
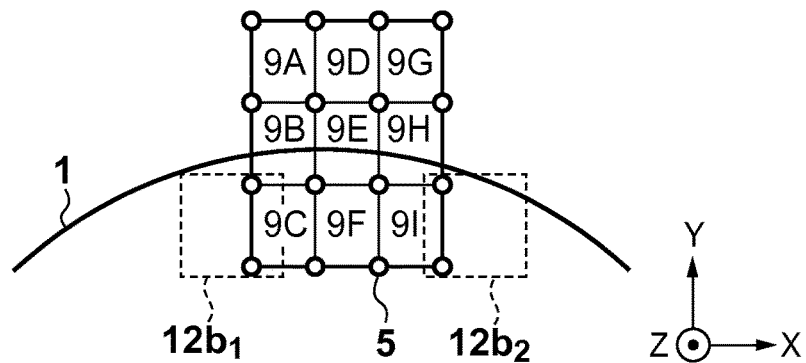
F I G. 9
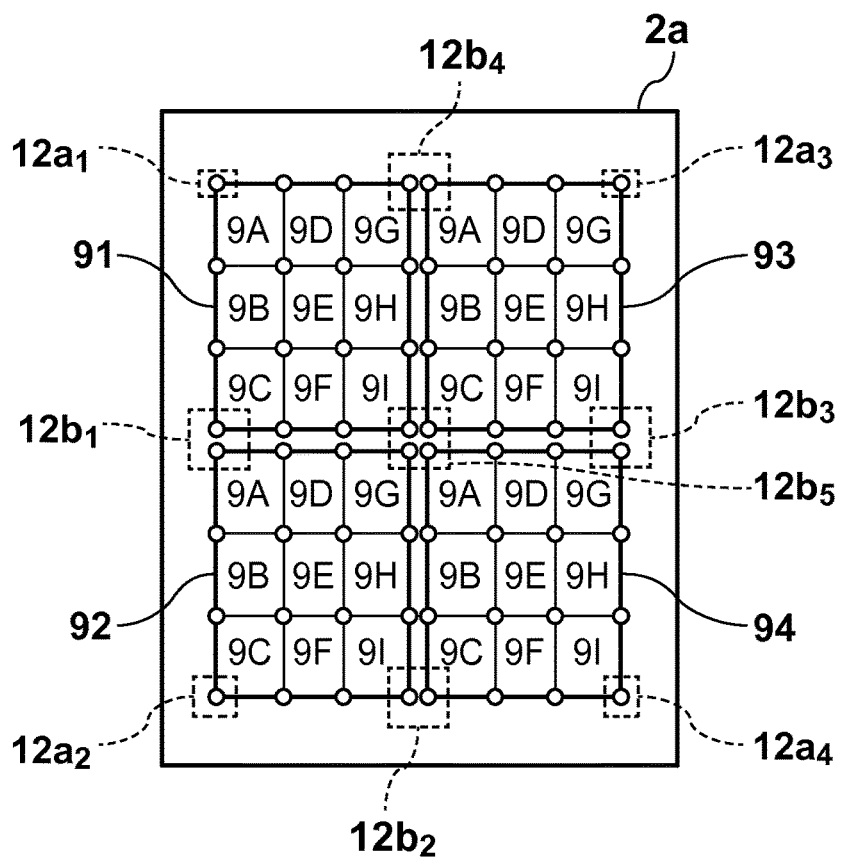

IMPRINT APPARATUS, METHOD OF MANUFACTURING ARTICLE AND ALIGNMENT APPARATUS

BACKGROUND OF THE INVENTION

Field of the Invention

The present invention relates to an imprint apparatus, a method of manufacturing an article and an alignment apparatus.

Description of the Related Art

An imprint technique that transfers a pattern formed on a mold onto a substrate is attracting attention as one of mass-production lithography techniques for magnetic storage media and semiconductor devices. In an imprint apparatus using this technique, a mold on which a pattern is formed and an imprint material supplied onto a substrate are brought into contact with each other, and the imprint material is cured in this state. The pattern of the mold can be transferred onto the substrate by separating the mold from the cured imprint material.

The manufacture of a semiconductor device or the like requires a step of overlaying a plurality of patterns on a single substrate. In an imprint apparatus, therefore, it is important to accurately transfer the pattern of a mold to a shot region formed on a substrate. Accordingly, Japanese Patent No. 4185941 has proposed an imprint apparatus using a die-by-die alignment method as an alignment method when transferring the pattern of a mold to a shot region. The die-by-die alignment method is an alignment method of detecting a mark formed in each shot region on a substrate and a mark formed on a mold, thereby correcting misalignment between the substrate and mold.

Recently, in order to increase the productivity, even when a shot region arranged in the peripheral portion of a substrate includes only one chip region, it is required to transfer the pattern of a mold to the chip region. This makes it necessary to accurately align the chip region and mold. In an imprint apparatus, a single scope generally detects one mark formed in a corresponding position of a shot region. However, when detecting a plurality of marks arranged in a region such as a chip region smaller than a shot region, the spacing between the marks to be detected is narrow. This poses the problem that scopes cannot be arranged so closely.

SUMMARY OF THE INVENTION

The present invention provides a technique advantageous in accurately transferring the pattern of a mold to a shot region formed on a substrate in an imprint apparatus.

According to one aspect of the present invention, there is provided an imprint apparatus which cures an imprint material on a substrate while a mold on which a pattern is formed is in contact with the imprint material, and transfers the pattern to each of a plurality of shot regions on the substrate, the apparatus comprising: at least one first detector configured to detect a first number of first marks among a plurality of marks formed in the plurality of shot regions; a second detector having a field of view wider than that of the first detector, and configured to detect a second number of second marks different from the first marks among the plurality of marks, the second number being larger than the first number; and a controller configured to align the plurality of shot regions and the mold by using a detection result from the second detector.

Further features of the present invention will become apparent from the following description of exemplary embodiments with reference to the attached drawings.

BRIEF DESCRIPTION OF THE DRAWINGS

FIG. 5A is a view showing an example of the layout of marks formed in a shot region;

FIG. 5B is a view showing an example of the layout of marks formed in a shot region;

FIG. 5C is a view showing an example of the layout of marks formed in a shot region;

FIG. 8 is a view showing the layout of marks formed in a shot region; and

FIG. 9 is a view showing a mold on which a plurality of pattern regions are formed.

DESCRIPTION OF THE EMBODIMENTS

Figure 1A:
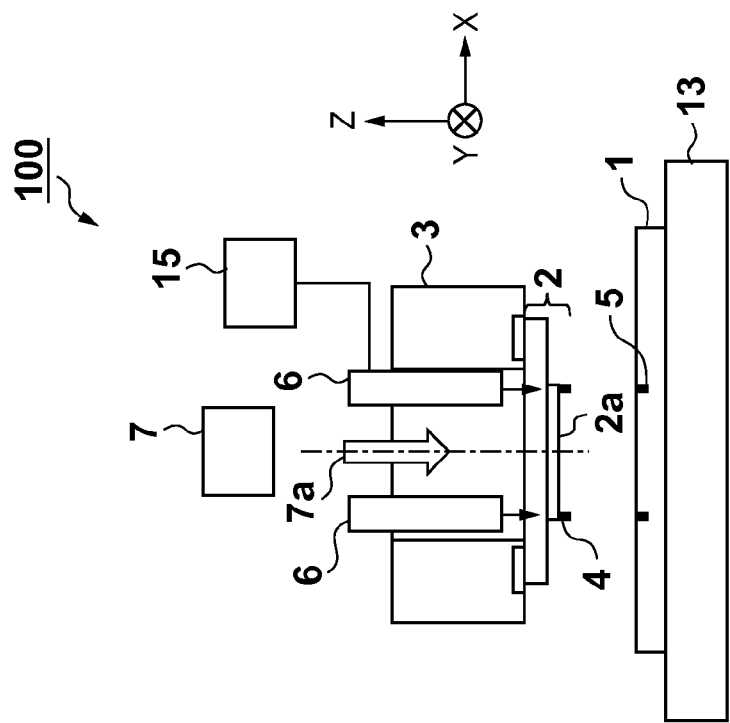
FIG. 1A is a schematic view showing the arrangement of an imprint apparatus of the first embodiment.

Exemplary embodiments of the present invention will be described below with reference to the accompanying drawings. Note that the same reference numerals denote the same members throughout the drawings, and a repetitive description thereof will not be given.

<First Embodiment>

An imprint apparatus 100 of the first embodiment of the present invention will be explained with reference to FIGS. 1A and 1B. The imprint apparatus 100 is used in the manufacture of a semiconductor device or the like, and cures an imprint material (resin) on a substrate while a mold having a pattern formed on it is in contact with the imprint material. The imprint apparatus 100 performs imprint processing that transfers the pattern onto the substrate by a process of separating the mold from the cured imprint material by widening the spacing between the mold and substrate. The imprint techniques include a heat cycle method using heat and photo-curing method using light. In the heat cycle method, a thermoplastic resin is supplied (dispensed) as the imprint material on a substrate. Then, the thermoplastic resin is heated to a temperature equal to or higher than the glass-transition temperature, thereby increasing the fluidity of the resin. In this state, a mold is pressed against the substrate with the resin being sandwiched between them, and cooling is performed. After that, a pattern can be formed on the substrate by separating the mold from the resin. On the other hand, in the photo-curing method, an uncured ultraviolet-curing resin is supplied as the imprint material on a substrate. Then, the ultraviolet-curing resin is irradiated with ultraviolet rays while a mold is pressed against the substrate with the resin being sandwiched between them. After the resin is cured by the ultraviolet irradiation, a pattern can be formed on the substrate by separating the mold from the resin. The heat cycle method poses the problems that the transfer time prolongs due to temperature control and the dimensional accuracy decreases due to a temperature change. On the other hand, the photo-curing method poses no such problems, and hence is presently advantageous in the mass-production of semiconductor devices or the like. In the imprint apparatus 100 of the first embodiment, the photo-curing method by which an ultraviolet-curing resin is supplied on a substrate and irradiated with ultraviolet rays (light) is applied.

Figure 1B:
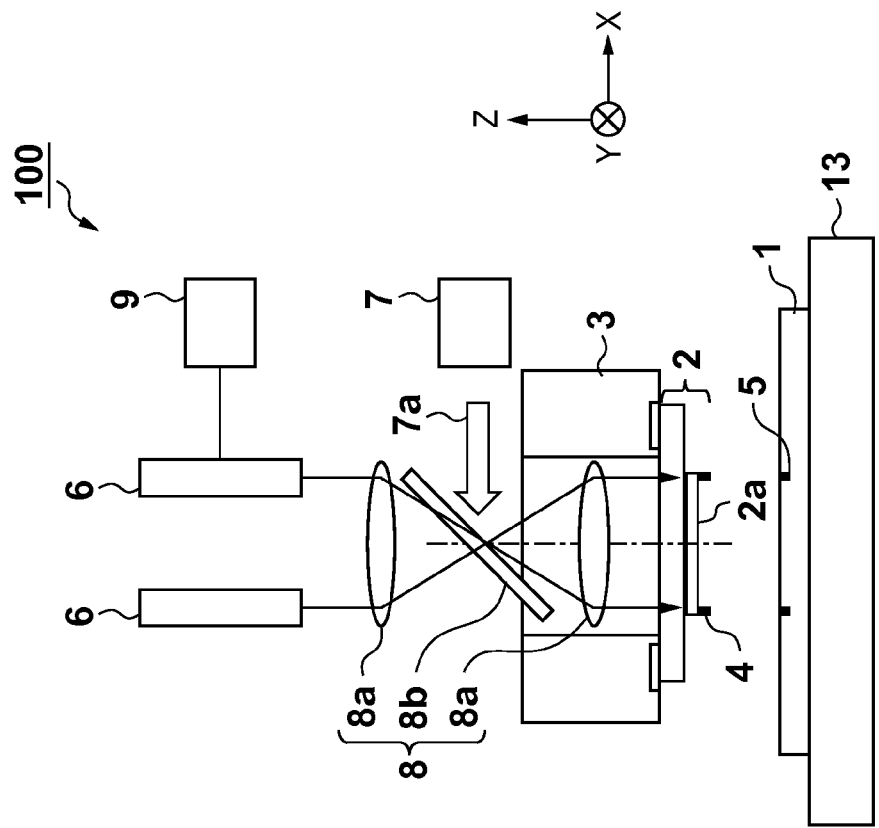
FIG. 1B is a schematic view showing another arrangement of the imprint apparatus of the first embodiment.

FIG. 1A is a schematic view showing the imprint apparatus 100 of the first embodiment. The imprint apparatus 100 of the first embodiment includes an imprint head 3 for holding a mold 2, a substrate stage 13 for holding a substrate 1, and a light source 7 for emitting light 7a (ultraviolet rays) that cures an imprint material supplied on the substrate. In this embodiment, an ultraviolet-curing resin that cures when irradiated with ultraviolet rays is used as the imprint material. The imprint apparatus 100 also includes a plurality of detectors 6 and a controller 15. The detectors 6 detect marks 4 formed on the mold 2 and marks 5 formed in a shot region of the substrate 1. The controller 15 obtains the relative positions of a shot region and a pattern of the mold 2 by using detection results from the detectors 6, thereby controlling alignment. In addition, the controller 15 controls imprint processing of the imprint apparatus 100. In the imprint apparatus 100 of the first embodiment, the plurality of detectors 6 are arranged in a space defined in the imprint head 3, and the light 7a emitted from the light source 7 irradiates the resin on the substrate 1. In the imprint apparatus 100 of the first embodiment, the light 7a irradiates the resin on the substrate 1 through a portion between the plurality of detectors 6. However, the present invention is not limited to this. For example, if the plurality of detectors 6 cannot be arranged in the space defined in the imprint head 3, the plurality of detectors 6 may also be arranged above the imprint head 3, as shown in FIG. 1B. In this arrangement, the plurality of detectors 6 detect images of the marks 4 formed on the mold 2 and images of marks formed on a shot region of the substrate 1 through an imaging optical system 8 including, for example, a lens 8a and optical member 8b. The light 7a emitted from the light source 7 is reflected by the optical member 8b in the imaging optical system 8, and guided onto the substrate 1. The optical member 8b has the characteristic that it reflects the light 7a (ultraviolet rays) that cures the resin supplied on the substrate 1 and transmits light emitted from the detector 6 and used to detect a mark.

The mold 2 is normally made of a material such as quartz capable of transmitting ultraviolet rays. A pattern portion 2a including a projection-and-recess pattern to be transferred to the resin on the substrate 1 is formed in a part of the substrate-side surface of the mold 2. In the pattern portion 2a, the marks 4 are formed to correspond to the marks 5 formed in a shot region on the substrate 1 in order to accurately transfer the pattern to the shot region on the substrate 1. The detectors 6 detect the marks 5 formed in a shot region on the substrate 1 through the marks 4 formed on the mold 2. The controller 15 obtains the relative positions of the substrate 1 and mold 2 by using the detection results from the detectors 6, and moves the substrate stage 13 and imprint head 3, thereby performing alignment such that the marks 4 of the mold 2 and the marks 5 on the substrate 1 overlap each other. If distortion or a difference of magnification is produced in the shot region on the substrate 1, the controller 15 applies a force to a side surface of the mold 2 by using a deformation mechanism (not shown), thereby deforming the mold 2 so that the pattern of the mold 2 overlaps the shot region. An actuator such as a piezoelectric element is used as the deformation mechanism. Consequently, the imprint processing can be performed by accurately overlaying the pattern of the mold 2 on the shot region on the substrate.

Figure 2:
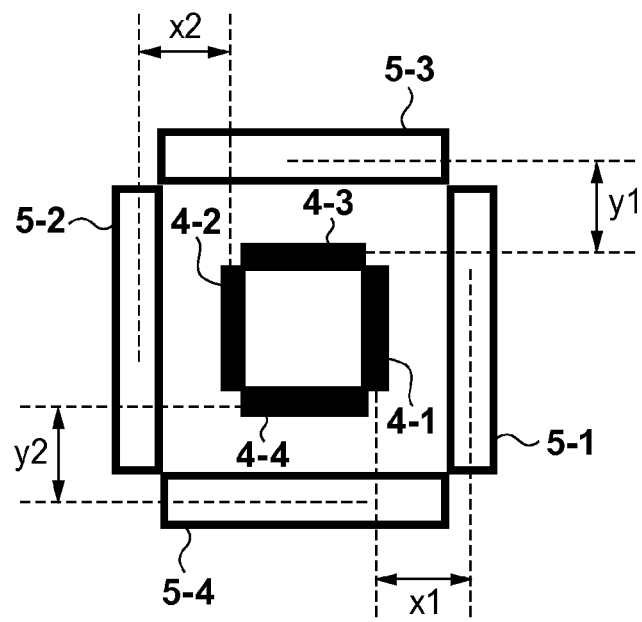
FIG. 2 is a view showing an example of a mark on a mold and an example of a mark on a shot region.
Figure 3:
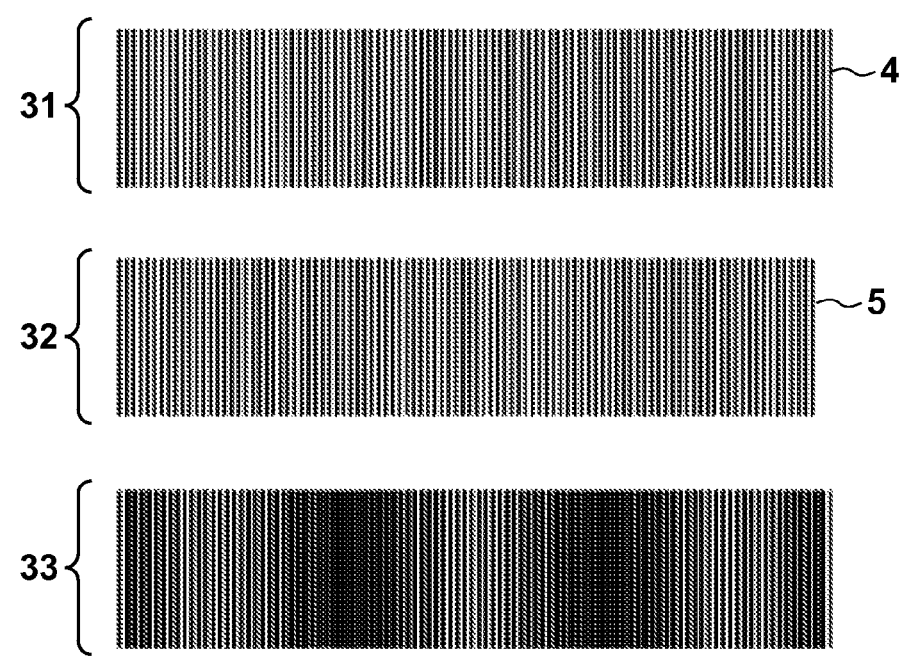
FIG. 3 is a view showing an example of a mark on a mold and an example of a mark on a shot region.

A method of detecting the marks 4 formed on the mold 2 and the marks 5 formed on a shot region of the substrate 1 by using the detectors 6 will be explained with reference to FIGS. 2 and 3. FIGS. 2 and 3 are views showing examples of the mark 4 on the mold 2 and the mark 5 on the shot region. FIG. 2 shows a so-called Box in Box mark in which the square mark 4 on the mold 2 is arranged inside the square mark 5 on the shot region. When using this mark, the controller 15 can obtain, from the detection results from the detectors 6, the relative positions of the marks 4 and 5 by using the distances (x1, x2, y1, and y2) between the marks 4 and 5. In FIG. 2, for example, the distance x1 is the distance between a side 4-1 of the mark 4 and a side 5-1 of the mark 5, and the distance x2 is the distance between a side 4-2 of the mark 4 and a side 5-2 of the mark 5. Also, the distance y1 is the distance between a side 4-3 of the mark 4 and a side 5-3 of the mark 5, and the distance y2 is the distance between a side 4-4 of the mark 4 and a side 5-4 of the mark 5. The controller 15 aligns the pattern of the mold 2 and the shot region so as to decrease the differences between these distances (x1, x2, y1, and y2) obtained from the mark detection results and designed values. Alternatively, the controller 15 aligns the pattern of the mold 2 and the shot region so as to decrease the difference between the distances x1 and x2, and the difference between the distances y1 and y2.

Also, as shown in FIG. 3, there is a method of forming grating patterns having different pitches as the mark 4 on the mold 2 and the mark 5 on the shot region, and obtaining the relative positions by overlaying the grating patterns. In FIG. 3, reference numeral 31 denotes a grating pattern as the mark 4 on the mold 2; 32, a grating pattern as the mark 5 on the shot region; and 33, a result obtained by overlaying the marks 4 and 5. As indicated by 31 and 32 in FIG. 3, the mark 4 on the mold 2 and the mark 5 on the shot region form grating patterns having different pitches. When the marks 4 and 5 are overlaid, therefore, a moire fringe is produced by the pitch difference as indicated by 33 in FIG. 3. This moire fringe can make the positional difference between the marks 4 and 5 larger than the real one. Accordingly, the relative positions of the marks 4 and 5 can accurately be obtained.

Figure 4:
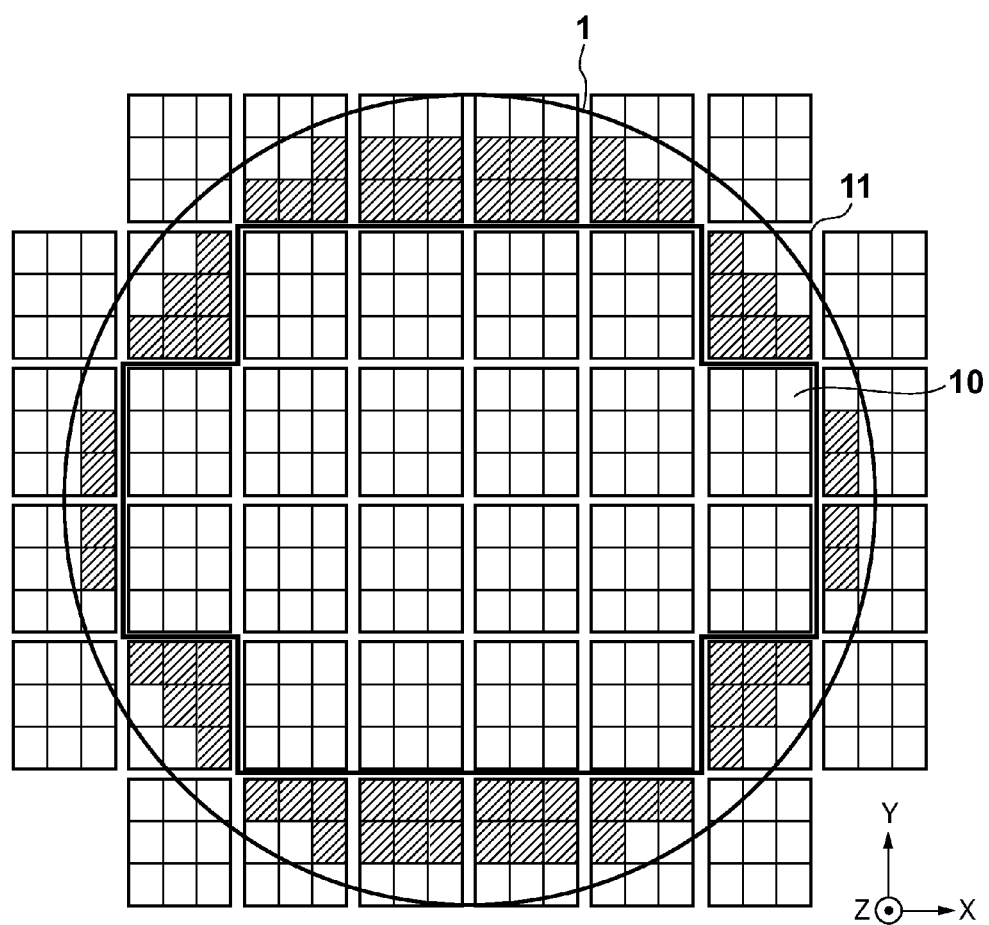
FIG. 4 is a view showing the layout of a plurality of shot regions on a substrate.

Next, the alignment of the pattern of the mold 2 and the shot region will be explained. FIG. 4 is a view showing the layout of a plurality of shot regions on the substrate 1. FIGS. 5A, 5B, and 5C are views each showing the layout of marks formed in a shot region. In the first embodiment, as shown in FIGS. 5A, 5B, and 5C, the shot region includes nine chip regions (9A to 9I), and the marks 5 on the shot region are arranged in the four corners of each chip region. Also, in FIGS. 5A, 5B, and 5C, each broken-line square indicates an observation field of view (to be referred to as a field of view 12 hereinafter) of the detector 6. Generally, when the field of view of the detector 6 (a scope) is narrowed, that is, when the magnification of the detector 6 is increased, the detector 6 can detect the mark 5 on the substrate at a high pixel density, and hence can accurately detect the mark 5. That is, the size of the field of view and the accuracy of detection of the mark 5 have a tradeoff relationship. In addition, the detector can be downsized by narrowing its field of view.

As shown in FIG. 4, all of the nine chip regions are formed on the substrate in each shot region 10 arranged in a central portion (a thick-line portion in FIG. 4) of the substrate 1. In the shot region 10 like this, as shown in, for example, FIG. 5A, the detectors 6 need only detect marks $5a_1$ to $5a_4$ arranged in the four corners of the shot region 10, and the corresponding marks 4 on the mold. The imprint apparatus 100 obtains the relative positions of the substrate 1 and mold 2 from the detection results from the detectors 6, and accurately overlays the pattern of the mold 2 on the shot region 10 on the substrate while performing shift correction and/or magnification correction. In this example shown in FIG. 5A, the imprint apparatus 100 includes a plurality of (four) detectors 6 (first detectors 6a) each having a field of view covering only one mark 5, so the first detectors 6a need only simultaneously detect the marks $5a_1$ to $5a_4$ arranged in the four corners of the shot region 10. For example, in the imprint apparatus 100 as shown in FIG. 5A, the four first detectors 6a are arranged such that a field of view $12a_1$ of one first detector 6a covers the mark $5a_1$, and a field of view $12a_2$ of another first detector 6a covers the mark $5a_2$. Likewise, in the imprint apparatus 100, the first detectors 6a are arranged such that a field of view $12a_3$ of another first detector 6a covers the mark $5a_3$, and a field of view $12a_4$ of another first detector 6a covers the mark $5a_4$. The imprint apparatus 100 causes the four first detectors 6a to simultaneously detect the marks $5a_1$ to $5a_4$. Thus, in the shot region 10 arranged in the central portion of the substrate 1, the relative positions of the shot region 10 and the pattern of the mold 2 can be obtained by detecting the marks 5 arranged in the four corners of the shot region 10 by the plurality of first detectors 6a.

On the other hand, a shot region (to be referred to as a deficient shot region 11 hereinafter) arranged in the peripheral portion of the substrate 1 includes the periphery of the substrate 1, and hence is formed to be partially deficient. For example, FIGS. 5B and 5C show examples of the deficient shot region 11 arranged in the peripheral portion of the substrate 1. Referring to FIGS. 5B and 5C, the deficient shot region 11 includes both a chip region (to be referred to as an effective chip region hereinafter) that forms a chip not including the periphery of the substrate 1 and usable as a product, and a chip region that forms a chip including the periphery of the substrate 1 and unusable as a product. In FIG. 5B, a chip region 9C is formed in the deficient shot region 11 without including the periphery of the substrate 1, so this chip region is an effective chip region usable as a product. In FIG. 5C, chip regions 9C, 9F, and 9I are formed in the deficient shot region 11. The chip regions 9C, 9F, and 9I are formed without including the periphery of the substrate 1, so these chip regions are effective chip regions.

Recently, to increase the productivity, even when only one effective chip region is formed in the deficient shot region 11 arranged in the peripheral portion of the substrate 1, it is required to transfer the pattern of the mold 2 to this effective chip region. Accordingly, it is necessary to detect a plurality of marks arranged in the deficient shot region 11, and accurately align the deficient shot region 11 and the pattern of the mold 2. However, the spacing between the plurality of marks arranged in the deficient shot region 11 is sometimes smaller than the dimensions of the first detector 6a in the X and Y directions. That is, the spacing between the plurality of marks is sometimes smaller than a distance at which the plurality of first detectors 6a can detect marks at the same time. This may pose the problem that the plurality of first detectors 6a cannot be positioned as close as the spacing between the plurality of marks.

For example, when the deficient shot region 11 includes only the chip region 9C as shown in FIG. 5B, the deficient shot region 11 and the pattern of the mold 2 can accurately be aligned by detecting the four marks formed in the four corners of the chip region 9C. In this case, the four marks formed in the four corners of the chip region need only be detected by using the four first detectors 6a. However, when detecting a plurality of marks formed in a region such as the chip region 9C smaller than a shot region, if the spacing between the plurality of marks is smaller than the dimensions of the first detector 6a in the X and Y directions, it may become difficult to position the four first detectors 6a so closely. Assume that the deficient shot region 11 includes the chip regions 9C, 9F, and 9I as shown in FIG. 5C. In this case, the deficient shot region 11 and the pattern of the mold 2 can accurately be aligned by detecting two marks formed on the left side of the chip region 9C and two marks formed on the right side of the chip region 9I. Therefore, the four marks formed on the left side of the chip region 9C and on the right side of the chip region 9I need only be detected by the four first detectors 6a in this case as well. However, if the spacing between the plurality of marks in the Y direction is smaller than the dimension of the first detector 6a in the Y direction, it may become difficult to position the two first detectors 6a arranged in the Y direction close to each other in this case as well.

Figure 6A:
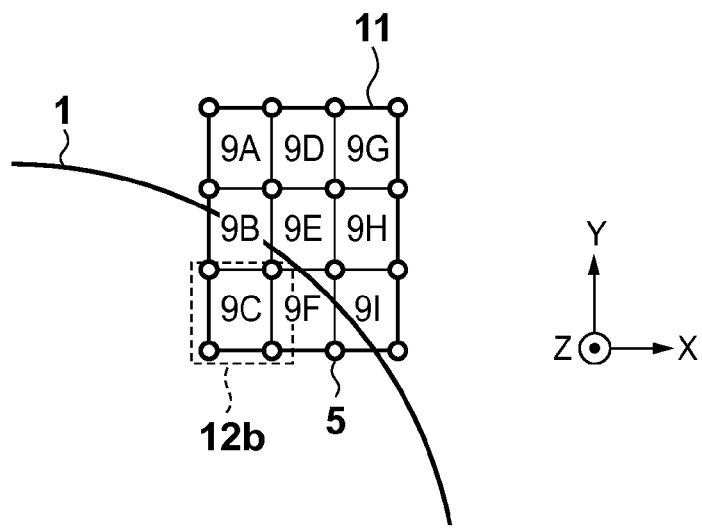
FIG. 6A is a view showing an example of the layout of marks formed in a shot region.

An example of a method of solving this problem is a method using a detector 6 (a second detector 6b) having a field of view covering at least one whole chip region. Assume that the deficient shot region 11 includes only the chip region 9C and the four marks formed in the four corners of the chip region 9C are to be detected as shown in FIG. 5B. In this case, when the second detector 6b is arranged such that a field of view 12b covers the chip region 9C, the second detector 6b can detect the four marks formed in the four corners of the chip region 9C at once as shown in FIG. 6A. By thus using the second detector 6b designed to cover the chip region in its field of view, a plurality of marks arranged at a distance at which the first detectors 6a having a narrow field of view cannot be positioned can be detected. Consequently, the relative positions of the substrate 1 and mold 2 can be aligned with respect to the chip region 9C.

When detecting the four marks at once by the second detector 6b, aberration occurs in the direction away from the center of the field of view 12b, so the detection result from the second detector 6b sometimes contains an error. This makes it difficult to accurately align the deficient shot region 11 and the mold pattern. In the imprint apparatus 100 of the first embodiment, therefore, it is also possible to use, for example, both the second detector 6b for detecting the four marks formed in the four corners of the chip region 9C at once, and the first detector 6a for detecting marks formed in a region different from the chip region 9C. That is, the imprint apparatus 100 of the first embodiment may also be designed such that the first detector 6a and second detector 6b can simultaneously detect a plurality of marks formed in the deficient shot region 11. By using the first detector 6a and second detector 6b together, the imprint apparatus 100 can detect more marks arranged in the deficient shot region 11. This makes it possible to align the deficient shot region 11 and the pattern of the mold 2 more accurately than when using only the detection result from the second detector 6b. In the first embodiment, the first detector 6a is so designed that the field of view 12a covers one mark, and the second detector 6b is so designed that the field of view 12b covers four marks. However, the present invention is not limited to this. The second detector 6b need only be so designed that the second detector 6b has a field of view wider than that of the first detector 6a, and the number (a second number) of marks to be detected by the second detector 6b is larger than the number (a first number) of marks to be detected by the first detector 6a. Also, in the imprint apparatus 100 of the first embodiment, each of the first detector 6a and second detector 6b includes a driving device such as a linear motor, and can move in directions (the X and Y directions) parallel to the substrate surface. The controller 15 controls the movements of the first detector 6a and second detector 6b in accordance with the position of a mark to be detected.

Figure 6B:
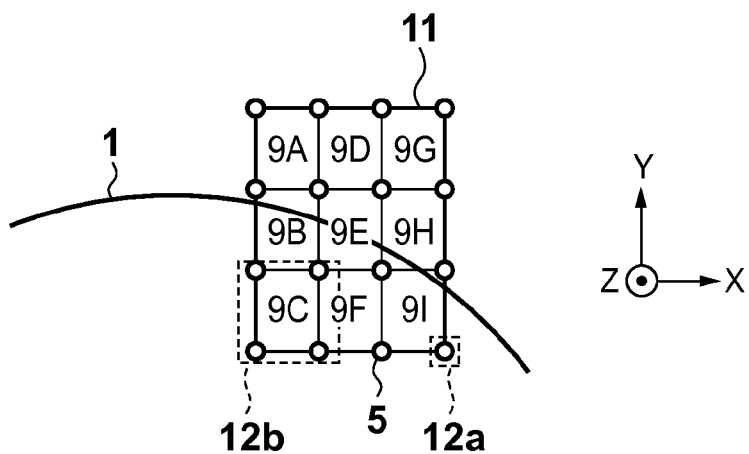
FIG. 6B is a view showing an example of the layout of marks formed in a shot region.

Next, examples in which the first detector 6a and second detector 6b detect a plurality of marks formed in the deficient shot region 11 arranged in the peripheral portion of the substrate 1 in the imprint apparatus 100 of the first embodiment will be explained with reference to FIGS. 6A and 6B. In the following explanation, a mark to be detected by the first detector 6a will be referred to as a first mark, and a mark to be detected by the second detector 6b will be referred to as a second mark. FIGS. 6A and 6B are views showing examples of the deficient shot region 11 arranged in the peripheral portion of the substrate 1. FIG. 6A shows an example in which only the chip region 9C of the nine chip regions is arranged in the deficient shot region 11 in the same manner as in FIG. 5B. In this example, the controller 15 determines that four marks formed in the four corners of the chip region 9C are second marks. The controller 15 moves the second detector 6b so that the field of view 12b of the second detector 6b covers the determined second marks. In this state, the second detector 6b is arranged as shown in, for example, FIG. 7B. Then, the controller 15 causes the second detector 6b to simultaneously detect the second marks, and arrange first detectors $6a_2$ and $6a_2$ so as not to interfere with the field of view 12b of the second detector 6b. Note that only a plurality of first detectors (for example, $6a_2$ and $6a_2$) are sometimes used without using the second detector 6b. In this case, as shown in, for example, FIG. 7C, the imprint apparatus 100 can move the first detectors $6a_2$ and $6a_2$ in the X and Y directions so that the fields of view of the first detectors $6a_2$ and $6a_2$ cover predetermined marks in the shot region.

Figure 7A:
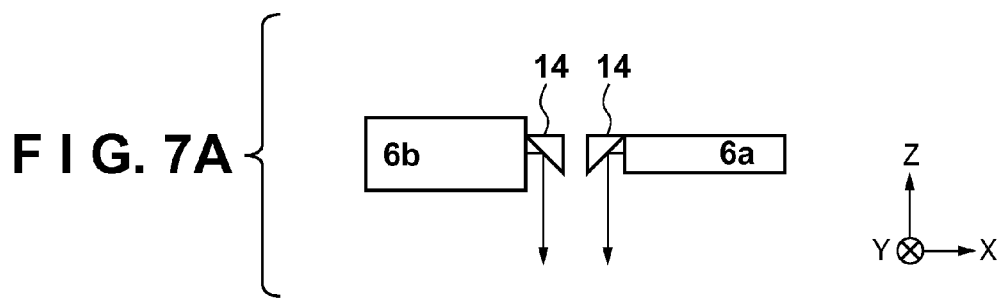
FIG. 7A is a view showing an example of the layout of first and second detectors.
Figure 7B:
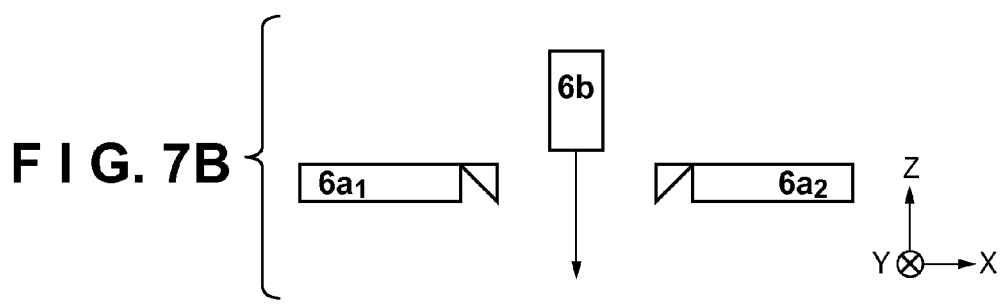
FIG. 7B is a view showing an example of the layout of the first and second detectors.
Figure 7C:
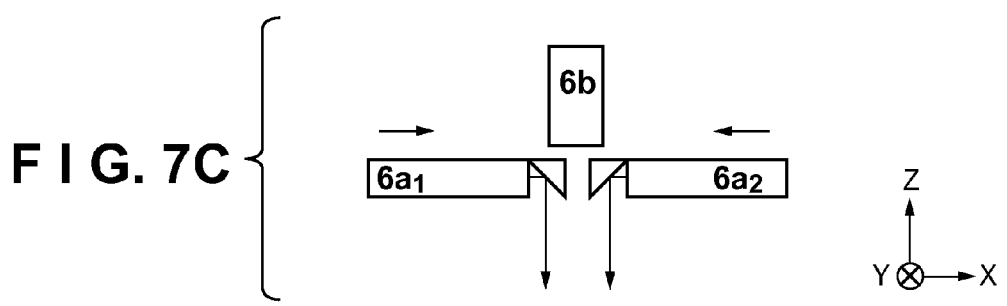
FIG. 7C is a view showing an example of the layout of the first and second detectors.

FIG. 6B shows an example in which the chip regions 9C and 9F of the nine chip regions are arranged in the deficient shot region 11. In this example, the controller 15 so determines that four marks formed in the four corners of the chip region 9C are second marks, and a mark arranged in the lower right corner of the chip region 9I is a first mark. The controller 15 moves the first detector 6a and second detector 6b such that the field of view 12a of the first detector 6a covers the determined first mark, and the field of view 12b of the second detector 6b covers the determined second marks. The field of view 12b of the second detector 6b is wider than the field of view 12a of the first detector 6a. Thus, when a mark formed outside a chip region as a detection target of the second detector 6b is detectable, the mark is detected by using the first detector 6a. Then, the controller 15 causes the first detector 6a to detect the first mark and the second detector 6b to detect the four second marks at the same time. In the example shown in FIG. 6B, the controller 15 determines the first mark to be detected by the first detector 6a and the second marks to be detected by the second detector 6b so as to increase the distance between them. When thus determining the first and second marks so as to increase the distance between them, a rotation or shift of the deficient shot region 11 can accurately be detected. This makes it possible to more accurately align the deficient shot region 11 and the pattern of the mold 2. In this state, the first detector 6a and second detector 6b are arranged as shown in, for example, FIG. 7A. FIG. 7A is a view showing the layout of the first detector 6a and second detector 6b. Referring to FIG. 7A, the optical paths of the first detector 6a and second detector 6b are bent by mirrors 14. The controller 15 causes the first detector 6a to detect the first mark and the second detector 6b to detect the four second marks at the same time. In the above-described examples, one first detector 6a and one second detector 6b are used in the imprint apparatus 100 of the first embodiment. However, the present invention is not limited to this, and it is also possible to use a plurality of first detectors 6a and a plurality of second detectors 6b.

Figure 7D:
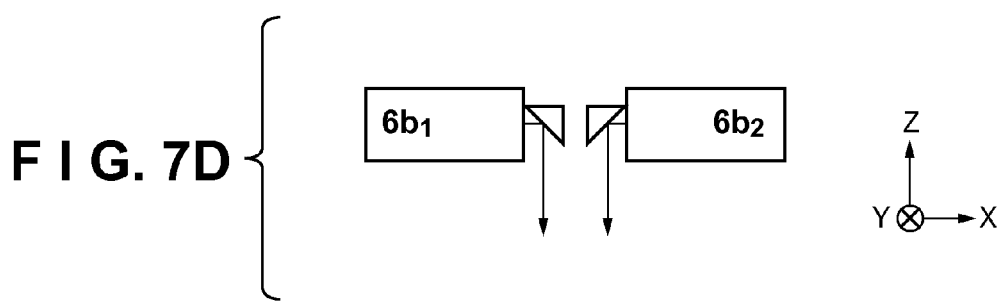
FIG. 7D is a view showing an example of the layout of a plurality of second detectors.

In the imprint apparatus 100 of the first embodiment, a plurality of marks formed in the deficient shot region 11 are detected by using the first detector 6a and second detector 6b together. However, it is also possible to detect the plurality of marks by using, for example, a plurality of second detectors 6b. An example using two second detectors $6b_1$ and $6b_2$ will be explained below. FIG. 8 shows an example in which the chip regions 9C, 9F, and 9I of the nine chip regions are arranged in the deficient shot region 11 in the same manner as in FIG. 5C. In this example shown in FIG. 8, the controller 15 determines that, for example, two marks formed on the left side of the chip region 9C and two marks formed on the right side of the chip region 9I are second marks. The controller 15 moves the second detectors $6b_1$ and $6b_2$ such that a field of view $12b_1$ of the second detector $6b_1$ covers the two second marks formed on the left side of the chip region 9C, and a field of view $12b_2$ of the second detector $6b_2$ covers the two second marks formed on the right side of the chip region 9I. In this state, the second detectors $6b_1$ and $6b_2$ are arranged as shown in, for example, FIG. 7D. Then, the controller 15 causes the second detector $6b_1$ to detect the two second marks formed on the left side of the chip region 9C and the second detector $6b_2$ to detect the two second marks formed on the right side of the chip region 9I at the same time. Since this makes it possible to detect more marks arranged in the deficient shot region 11, the deficient shot region 11 and the pattern of the mold 2 can accurately be aligned.

Also, a method of simultaneously imprinting a plurality of shot regions has been invented because it takes a long time to transfer a pattern onto a substrate for each shot region by using the imprint apparatus. FIG. 9 is a view in which four pattern regions 91 to 94 are formed on one mold 2 (the pattern portion 2a). When the plurality of pattern regions 91 to 94 are thus formed, it is necessary to detect more marks, in addition to marks conventionally formed in the four corners of a pattern region, in order to align the pattern of the mold 2 and a shot region. That is, since the pattern formation region (pattern region) widens, the shape difference between a shot region on a substrate and the pattern region formed on the mold contains not only a linear component but also a high-order component and hence has a large influence. This makes it necessary to correct the shape difference of the high-order component. When using the conventional four points in the four corners, however, the shape difference of the high-order component cannot be obtained because necessary mark information is little.

FIG. 9 shows an example in which nine points are measured. In this case, adjacent marks in, for example, pattern regions 91 and 92 (a mark in the lower left corner of the pattern region 91 and a mark in the upper left corner of the pattern region 92) are formed within the range of about a few hundred μm to a few mm. Therefore, it is difficult to detect these marks by using different first detectors 6a (scopes). That is, these scopes cannot be arranged so closely.

Accordingly, the controller 15 moves the second detector 6b$_1$ so that the field of view 12b$_1$ of the second detector 6b$_1$ covers the adjacent marks in the pattern regions 91 and 92 (the mark in the lower left corner of the pattern region 91 and the mark in the upper left corner of the pattern region 92) as second marks. Similarly, the controller 15 moves the second detector 6b$_2$ so that the field of view 12b$_2$ of the second detector 6b$_2$ covers adjacent marks in pattern regions 92 and 94 (a mark in the lower right corner of the pattern region 92 and a mark in the lower left corner of the pattern region 94) as second marks. Also, the controller 15 moves a second detector 6b$_3$ so that a field of view 12b$_3$ of the second detector 6b$_3$ covers adjacent marks in the pattern regions 93 and 94 (a mark in the lower right corner of the pattern region 93 and a mark in the upper right corner of the pattern region 94) as second marks. In addition, the controller 15 moves a second detector 6b$_4$ so that a field of view 12b$_4$ of the second detector 6b$_4$ covers adjacent marks in pattern regions 91 and 93 (a mark in the upper right corner of the pattern region 91 and a mark in the upper left corner of the pattern region 93) as second marks.

Furthermore, the controller 15 moves a second detector 6b$_5$ so that a field of view 12b$_5$ of the second detector 6b$_5$ covers adjacent marks in the pattern regions 91, 92, 93, and 94 in the central portion of the mold as second marks. The adjacent marks in the pattern regions 91 to 94 are a mark in the lower right corner of the pattern region 91, a mark in the upper right corner of the pattern region 92, a mark in the lower left corner of the pattern region 93, and a mark in the upper left corner of the pattern region 94. By thus simultaneously detecting the marks by using the first detector 6a and second detectors 6b, it is possible to detect the marks formed in the four corners of each of the pattern regions 91 to 94 formed on the mold 2. Accordingly, the shot region on the substrate and the pattern region on the mold can accurately be aligned by detecting the marks by using the first detector 6a and second detectors 6b as in the above-mentioned embodiment.

A method by which the controller 15 determines first and second marks from a plurality of marks formed in the deficient shot region 11 will now be explained. In accordance with the layout of a plurality of marks in the deficient shot region 11, the controller 15 determines first and second marks from the plurality of marks. For example, of the plurality of marks formed in the deficient shot region 11, if marks are closely arranged so that a plurality of first detectors 6a cannot be arranged so closely, the controller 15 determines that two to four adjacent marks of the plurality of marks are second marks. Then, the controller 15 determines that a mark positioned farthest from the determined second marks is a first mark. As shown in FIG. 4, the layout of a plurality of shot regions arranged on a substrate is often determined in accordance with the size of each shot region. In this case, in the deficient shot region 11 arranged in the peripheral portion of the substrate 1, the layout of a plurality of marks is also determined in accordance with the position on the substrate. Therefore, the controller 15 may also determine first and second marks in accordance with the position where the deficient shot region 11 is arranged on the substrate, for each lot by which the size of the shot region changes. Also, if a plurality of detectors 6 including the first and second detectors 6a and 6b are moved for each shot region, vibrations may occur in the imprint apparatus, or it may take a considerable time to move the plurality of detectors 6. Accordingly, the controller 15 may also determine first and second marks so as to minimize the movements of the detectors 6.

As described above, the imprint apparatus 100 of the first embodiment is so designed as to include the first detector 6a for detecting one mark, and the second detector 6b for detecting a plurality of marks formed in one chip region at once. The imprint apparatus 100 simultaneously detects a plurality of marks formed in a shot region by using the first detector 6a and second detector 6b together. Therefore, even the deficient shot region 11 arranged in the peripheral portion of the substrate 1 can accurately be aligned with the pattern of the mold 2. That is, the pattern of the mold 2 can accurately be transferred to an effective chip region arranged in the deficient shot region 11.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing an article according to this embodiment includes a step of forming a pattern on a resin dispensed on a substrate (a step of performing imprint processing on the substrate) by using the above-mentioned imprint apparatus, and a step of processing the substrate on which the pattern is formed in the above step. This manufacturing method further includes other well-known steps (for example, oxidation, film formation, deposition, doping, planarization, etching, resist removal, dicing, bonding, and packaging). When compared to the conventional methods, the method of manufacturing an article according to this embodiment is advantageous in at least one of the performance, quality, productivity, and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-078093 filed on Apr. 3, 2013, which is hereby incorporated by reference herein in its entirety.

What is claimed is:

1. An imprint apparatus which forms a pattern of an imprint material on a shot region of a substrate by using a mold, wherein the shot region includes a chip region not including a periphery of the substrate, the apparatus comprising:

a first detector having a first field of view, and configured to detect marks arranged within the first field of view, among a plurality of marks formed in the shot region, through the mold;

a second detector having a second field of view which is wider than the first field of view of the first detector, and configured to detect marks arranged within the second field of view, among the plurality of marks, through the mold; and a controller configured to control alignment between the shot region and the mold based on detection results of the first detector and the second detector, wherein the controller determines, based on a layout of the plurality of marks formed in the shot region, marks provided in the chip region among the plurality of marks as second marks to be detected by the second detector, and marks different from the second marks among the plurality of marks as first marks to be detected by the first detector, and causes the first detector and the second detector to respectively detect the first marks and the second marks.

2. The apparatus according to claim 1, wherein the shot region includes a deficient shot region which is a partially deficient shot region arranged in a peripheral portion of the substrate, and to which a portion of the pattern formed on the mold is to be transferred.

3. The apparatus according to claim 2, wherein the controller determines, as the first marks, marks different from the second marks and covered by the first field of view, among the plurality of marks formed in the deficient shot region.

4. The apparatus according to claim 2, wherein the controller determines the first marks and the second marks, from the plurality of marks formed in the deficient shot region, in accordance with a position where the deficient shot region is arranged on the substrate.

5. The apparatus according to claim 1, wherein each of the first detector and the second detector is configured to move in a direction parallel to a substrate surface, and the controller controls movement of the first detector such that the first field of view covers the first marks, and controls movement of the second detector such that the second field of view covers the second marks.

6. The apparatus according to claim 1, wherein the controller causes the first detector and the second detector to respectively detect the first marks and the second marks while the mold and the imprint material are in contact with each other.

7. The apparatus according to claim 1, further comprising:
a light source configured to emit light which cures the imprint material; and
an optical member configured to guide light emitted from the first detector and the second detector and light emitted from the light source to the substrate through the mold.

8. An alignment apparatus which aligns a shot region of a substrate, wherein the shot region includes a chip region not including a periphery of the substrate, the apparatus comprising:

a first detector having a first field of view, and configured to detect marks arranged within the first field of view, among a plurality of marks formed in the shot region;
a second detector having a second field of view which is wider than the first field of view of the first detector, and configured to detect marks arranged within the second field of view, among the plurality of marks; and
a controller configured to control alignment of the substrate based on detection results of the first detector and the second detector,
wherein the controller
determines, based on a layout of the plurality of marks formed in the shot region, marks provided in the chip region among the plurality of marks as second marks to be detected by the second detector, and marks different from the second marks among the plurality of marks as first marks to be detected by the first detector, and
causes the first detector and the second detector to respectively detect the first marks and the second marks.

9. The apparatus according to claim 1, wherein the controller determines the first marks and the second marks, such that detection by the first detector and detection by the second detector are performed at the same time.

10. The apparatus according to claim 1, wherein the controller determines the first marks and the second marks, such that a distance between the first marks and the second marks is as large as possible.

11. The apparatus according to claim 1, wherein
the substrate includes a plurality of deficient shot regions each of which is a partially deficient shot region arranged in a peripheral portion of the substrate, and to which a portion of the pattern formed on the mold is to be transferred,
each of the plurality of deficient shot regions includes the chip region not including the periphery of the substrate,
the controller determines the first marks and the second marks, for each of the plurality of deficient shot regions.

12. The apparatus according to claim 1, wherein the second detector is configured to be able to include the chip region in the second field of view.

* * * * *